(12) United States Patent
Müller

(10) Patent No.: US 9,433,133 B2
(45) Date of Patent: Aug. 30, 2016

(54) DEVICE AND METHOD FOR COOLING AN ELECTRIC COMPONENT FOR A VEHICLE

(75) Inventor: Nikolaus Müller, Munich (DE)

(73) Assignee: RENK AG, Augsburg (DE)

( * ) Notice: Subject to any disclaimer, the term of this patent is extended or adjusted under 35 U.S.C. 154(b) by 673 days.

(21) Appl. No.: 12/863,620

(22) PCT Filed: Nov. 3, 2008

(86) PCT No.: PCT/EP2008/009252
§ 371 (c)(1),
(2), (4) Date: Jul. 20, 2010

(87) PCT Pub. No.: WO2009/092410
PCT Pub. Date: Jul. 30, 2009

(65) Prior Publication Data
US 2010/0287962 A1  Nov. 18, 2010

(30) Foreign Application Priority Data
Jan. 21, 2008  (DE) .................. 10 2008 005 353

(51) Int. Cl.
| | |
|---|---|
| *F28C 1/00* | (2006.01) |
| *F25D 23/12* | (2006.01) |
| *B60H 1/32* | (2006.01) |
| *F25B 9/00* | (2006.01) |
| *H05K 7/20* | (2006.01) |
| *B60R 16/023* | (2006.01) |

(Continued)

(52) U.S. Cl.
CPC ....... *H05K 7/20881* (2013.01); *B60R 16/0239* (2013.01); *F28D 15/0266* (2013.01); *H01L 23/427* (2013.01); *H05K 7/20936* (2013.01); *F28D 2015/0291* (2013.01); *H01L 2924/0002* (2013.01)

(58) Field of Classification Search
CPC .................. F28D 15/0266; F28D 2015/0291; H05K 7/20936; H05K 7/20881; H01L 23/427; B60H 1/00385
USPC ................ 62/239, 259.2, 121, 87, 244, 243, 62/323.3; 165/104.31; 60/519, 669, 645, 60/670, 671; 361/679.52
See application file for complete search history.

(56) References Cited

U.S. PATENT DOCUMENTS

| | | | |
|---|---|---|---|
| 3,715,885 A * | 2/1973 | Schur ............................. 60/496 |
| 6,877,318 B2 * | 4/2005 | Tadayon et al. ................ 60/651 |

(Continued)

FOREIGN PATENT DOCUMENTS

| | | |
|---|---|---|
| DE | G9309428.0 | 9/1993 |
| EP | 1 872 995 | 1/2008 |

(Continued)

OTHER PUBLICATIONS

JP 09186279 Machine Translation.*

*Primary Examiner* — Cassey D Bauer
*Assistant Examiner* — Joseph Trpisovsky
(74) *Attorney, Agent, or Firm* — Cozen O'Connor

(57) ABSTRACT

A cooling device for an arrangement with at least one electric component, particularly power electronics (1), for a vehicle, wherein the arrangement can be cooled by a fluid (2) using the method of evaporative cooling, includes a heat engine (4), in particular a steam turbine or a displacement machine for expanding fluid that is evaporated during evaporative cooling.

10 Claims, 2 Drawing Sheets

(51) Int. Cl.
    *F28D 15/02* (2006.01)
    *H01L 23/427* (2006.01)

(56) References Cited

U.S. PATENT DOCUMENTS

| | | | |
|---|---|---|---|
| 7,210,304 B2* | 5/2007 | Nagashima et al. | 62/259.2 |
| 2004/0118142 A1* | 6/2004 | Hsu et al. | 62/259.2 |
| 2005/0274507 A1* | 12/2005 | Sanada et al. | 165/202 |
| 2006/0056994 A1 | 3/2006 | Van Lear | |
| 2008/0093139 A1 | 4/2008 | Döbereiner et al. | |
| 2008/0178589 A1* | 7/2008 | He et al. | 60/531 |
| 2009/0242174 A1* | 10/2009 | McCutchen et al. | 165/104.25 |

FOREIGN PATENT DOCUMENTS

| | | |
|---|---|---|
| JP | 58-102547 | 6/1983 |
| JP | 58102547 | 6/1983 |
| JP | 09186279 | 7/1997 |

* cited by examiner

DEVICE AND METHOD FOR COOLING AN ELECTRIC COMPONENT FOR A VEHICLE

PRIORITY CLAIM

This is a U.S. national stage of application No. PCT/EP2008/00925, filed on Nov. 3, 2008. Priority is claimed on the following application: Country: Germany, Application No. 10 2008 005 353.8, Filed: Jan. 21, 2008, the content of which is incorporated herein by reference in its entirety.

FIELD OF THE INVENTION

The invention is directed to a cooling device for an arrangement with at least one electric component, particularly power electronics, for a vehicle, in particular a vehicle with an enclosed or partially enclosed powertrain compartment, wherein the arrangement can be cooled by a fluid using the method of evaporative cooling, to a vehicle with a cooling device of this kind, and to a method for cooling an arrangement with at least one electric component.

BACKGROUND OF THE INVENTION

Electric components, particularly electronic components such as those contained, for example, in power electronics for supplying electric energy which are used in so-called powerpacks, i.e., drive units comprising engine and transmission, for military vehicles have heretofore been mounted on a plate through which cooling water flows in order to carry off heat. Air which is actively circulated by means of fans flows around the upper side of the components to prevent local peak thermal loads. The repeated transfer of heat from the point of origin of the waste heat in the component to the cooling water via a plurality of housing walls requires a relatively large temperature difference between the cooling water and the component so that cooling water temperatures no higher than 70° C. are permitted.

It is well known from DE 93 09 428 U1 to cool electronic components by an evaporative cooling process. A drive unit with evaporation-cooled power electronics in a tracked vehicle or in a skid steer vehicle in which electronic components are cooled by a boiling fluid is known from in-house practice. The steam is condensed in a condenser and fed back to the power electronics as liquid. The enthalpy that is stored in the evaporated fluid is not put to use, and the cooling efficiency is therefore suboptimal.

Therefore, it is the object of the present invention to improve the cooling of an arrangement having at least one electric component in a vehicle.

SUMMARY OF THE INVENTION

A cooling device according to the invention is provided for cooling an arrangement with at least one electric component, in particular power electronics, for a vehicle and is constructed in such a way that the arrangement can be cooled by a fluid through evaporative cooling. To this end, there is provided in a preferred arrangement a fluid feed to and a fluid discharge from the arrangement and a fluid sump in which the electric components, preferably without a housing, are entirely or partially immersed. At the pressure present in the fluid sump, the fluid is preferably at a boiling temperature which lies below a critical operating temperature for these components. If different components of the arrangement have different critical operating temperatures, the fluid preferably has a boiling temperature lying below the lowest of these critical operating temperatures.

When the electric components give off heat, the fluid surrounding them, which is at least partially in liquid phase, absorbs this heat while boiling and evaporating. The fluid temperature advantageously remains substantially constant during the boiling process.

The vapor formed during boiling is fed, according to the invention, to a heat engine, for example, a turbine, in particular a steam turbine, or a displacement machine in which the vapor expands, i.e., the pressure of the fluid which is at least partially vaporous is reduced and energy is accordingly extracted from the vapor.

In a preferred embodiment of the present invention, the expansion takes place in the heat engine without a phase change for advantageous operation of the heat engine. However, it is also possible to expand the vapor entirely or partially into the liquid phase again, i.e., to condense it entirely or partially, while still in the heat engine.

According to the invention, energy is advantageously extracted from the cooling fluid on the one hand by expansion of the vapor in the heat engine. By reducing the energy of the steam in the heat engine, the thermal energy which must then be removed, for example, by a condenser or the like, can be advantageously reduced compared to a cooling device, known in-house, in which the thermal energy must be removed in its entirety by a condenser of this kind. This condenser can then be constructed correspondingly in a smaller and more compact manner.

On the other hand, the waste heat from the electric components can advantageously be used at least partially, for example, to operate pumps, generators and/or other consumers, and the efficiency of the cooling can be improved in this way.

In a preferred embodiment of the present invention, the fluid has an electrical conductivity of no more than $10^{-6}$ $(\Omega m)^{-1}$ at 20° C. so that it essentially serves as an electric insulator and in particular electrically insulates the electric components of the arrangement from one another. A particularly high-performance construction is made possible in this way.

The cooling device preferably has a condenser for recooling the fluid accompanied by at least partial condensation and an air pump which can be driven by the heat engine for applying a flow of air, e.g., surrounding air, to the condenser.

The cooling device is advantageously independent from a vehicle cooling system in that the air pump is powered by the heat engine energy. It can be tailored more precisely to the requirements of the electric components and operated independent from the operating state of a vehicle drive system. Further, the efficiency of the condenser can be improved in that air actively flows against the condenser, which in turn allows for more compact condensers.

In addition to, or as an alternative to, an air pump, a feed pump which can be driven by the heat engine can be provided for feeding at least partially condensed fluid back to the arrangement having at least one electric component. This feed pump conveys the at least partially condensed fluid from the low-pressure reservoir or low-pressure compensation vessel back to the arrangement. In this way, fluid can be actively recycled in an advantageous manner and the cooling efficiency can be improved in this way.

In addition to, or as an alternative to, an air pump and/or feed pump, a generator which can be driven by the heat engine can be provided for generating electric energy from the lost heat output of the arrangement. For example, a generator can be connected to a shaft of the heat engine to generate current when the heat engine is at overcapacity, which further improves the overall efficiency of the system. The generator can just as well be permanently connected to the heat engine or can be coupled with it electively, for example, by a clutch, so that the heat engine and generator can each be operated in the most advantageous speed ranges by means of a transmission connected therebetween. The power output at the heat engine and, therefore, the operation of the cooling device can preferably also be regulated by the generator. To this end, additionally or alternatively, control valves and/or controllable pumps, particularly an adjustable air pump and/or feed pump, can be provided.

The arrangement with at least one electric component can be arranged in a tightly closed housing which is at least partially filled with fluid and which has a fluid feed and/or fluid discharge and in which a fluid sump is formed in which the electric components, preferably without housing, are entirely or partially immersed.

This preferably separate, tightly closed housing can preferably be arranged, particularly integrated, in a powertrain compartment, for example, a transmission housing or electric motor housing.

A particularly advantageous application of a cooling device according to the invention is in tracked vehicles or skid steer vehicles having an enclosed or at least partially enclosed powertrain compartment.

Since the cooling device is advantageously independent from the cooling water, the limitation on the cooling water temperature mentioned above is no longer required. Also, at high outside temperatures, for example, above 50° C., it can be ensured that the electronics will not overheat. According to the invention, power electronics can therefore be advantageously integrated in the at least partially enclosed powertrain compartment, where temperatures appreciably above 100° C. can sometimes occur.

BRIEF DESCRIPTION OF THE DRAWINGS

Further advantages and features are indicated in the dependent claims and discussed in connection with the description of a preferred embodiment and the accompanying drawing figure in which.

DETAILED DESCRIPTION OF THE PRESENTLY PREFERRED EMBODIMENTS

Figure 1:
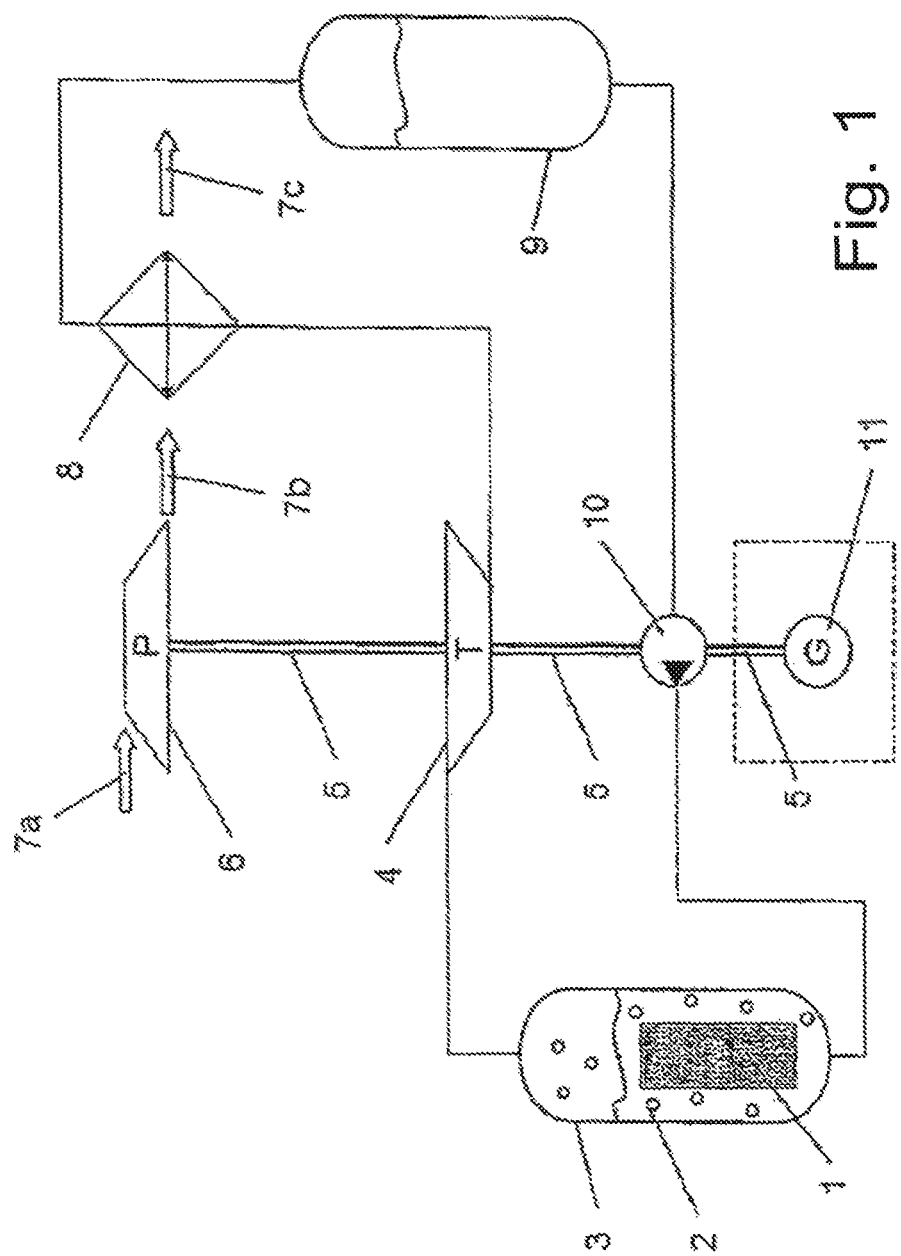
FIG. 1 is a partly schematic view showing a cooling device according to the present invention.
Figure 2:
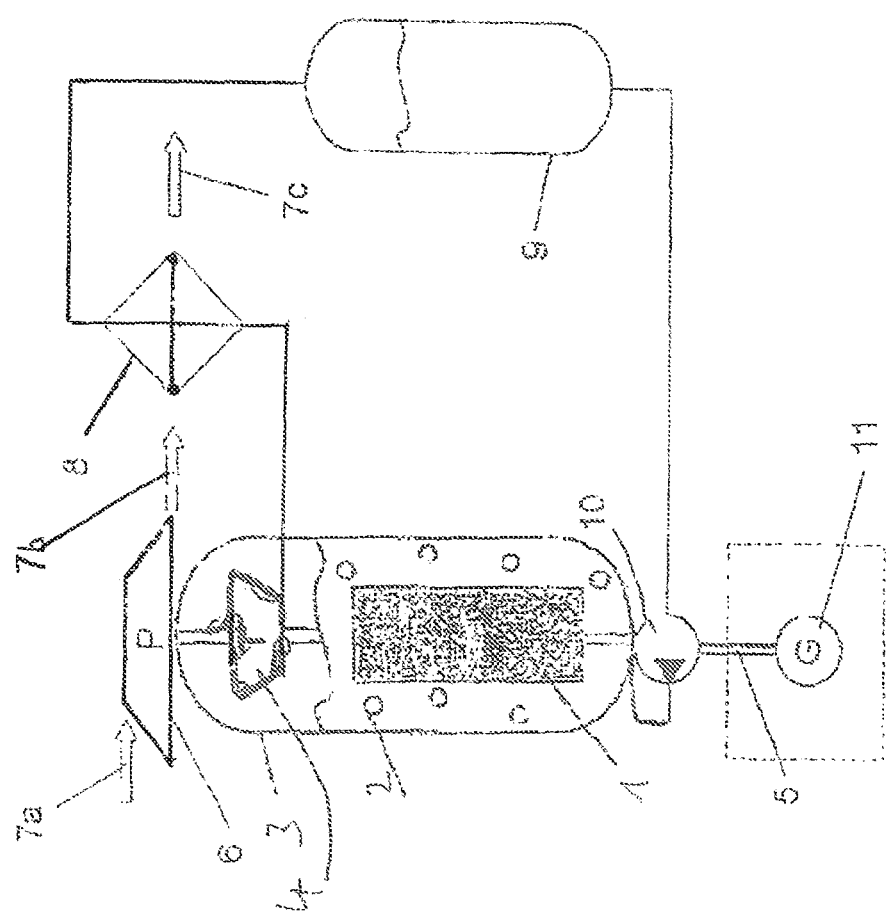
FIG. 2 is a schematic drawing showing another embodiment of the cooling device according to the present invention.

The cooling device shown in FIG. 1 is provided for long-term cooling of power electronics 1 integrated in an enclosed powertrain compartment of a vehicle (not shown).

In normal operation, the liquid phase of a fluid 2 in the form of saturated vapor, i.e., fluid 2 in liquid as well as gaseous or vaporous phase, washes around and completely covers the electronics 1 so as to prevent the overheating of components of the power electronics 1 at all times and, at the same time, to ensure that they are electrically insulated from one another and from a fluid-tight housing 3. This also holds true for inclined positions such as regularly occur in tracked vehicles in particular.

In operation, the electronics 1 generate heat which they give off to the fluid 2. This leads to a partial evaporation of the liquid phase of the fluid 2; however, the liquid phase continues to wash around and completely cover the electronics 1. The occurring vapor, i.e., the gaseous or vaporous phase of the fluid 2, collects in the upper area of the cooling device housing 3 due to gravity. The cooling device housing 3 is constructed as a pressure-tight vessel.

An overpressure is formed in the vessel 3 due to the evaporation of the fluid. The fluid vapor is guided off to a heat engine in the form of a turbine 4 which is preferably located in the upper shell of the vessel and communicates with a fluid discharge arranged at the latter.

The turbine 4 expands the vapor and, in so doing, delivers energy to a shaft 5. The turbine 4 accordingly divides a high-pressure side of the fluid vapor from a low-pressure side of the fluid vapor. The expanded vapor is conveyed to a condenser 8.

The shaft energy of the shaft 5 is primarily consumed by an air pump 6 which sucks in surrounding air 7a and generates a cooling air flow 7b and 7c, respectively, which flows through the condenser 8 on an air side. The condensation energy of the fluid is transferred to the air and then into the environment.

The fluid is at least partially condensed in the condenser 8. The fluid condensate collects in a reservoir 9. The reservoir 9 is likewise constructed so as to be tight against pressure. Liquid fluid is conveyed back through a fluid feed into the pressure space of the cooling device housing 3 by a feed pump 10. The feed pump 10 is connected by the shaft 5 to the turbine 4 which accordingly supplies the feed pump 10 with energy.

Optionally, a generator 11 may be coupled with the shaft 5. The generator 11 takes off surplus shaft energy, stores it in an electric buffer circuit and accordingly improves the overall efficiency of the system.

The invention is not limited by the embodiments described above which are presented as examples only but can be modified in various ways within the scope of protection defined by the appended patent claims.

The invention claimed is:

1. A cooling device for a vehicle comprising:
   a pressure-tight housing (3) having an upper shell;
   a condenser (8);
   an arrangement disposed within said housing including at least one electric component;
   a fluid (2) within said housing for cooling said electric component by evaporative cooling thereby generating evaporated fluid; and
   a turbine (4) disposed within the upper shell of said housing for expanding said evaporated fluid and for dividing a high pressure side of the fluid vapor from a low pressure side of the fluid vapor and for extracting energy from said vapor; said housing having a fluid discharge for conveying said expanded fluid to said condenser (8);
   wherein said arrangement comprises a plurality of electrical components;
   wherein the fluid has an electrical conductivity of no more than $10^{-6}$ $(\Omega m)^{-1}$ at 20° C. and substantially electrically insulates said electric components of said arrangement from one another;
   a feed pump (10) driven by said turbine feeds at least partially condensed fluid to said arrangement including said at least one electric component; and
   wherein said cooling device is independent of a cooling water cycle of the vehicle.

2. The cooling device according to claim 1, wherein the fluid has a boiling temperature which lies below a critical operating temperature of said at least one electric component of said arrangement.

3. The cooling device according to claim 1, additionally comprising an air pump (6) driven by said turbine.

4. The cooling device according to claim 3, said condenser (8) disposed outside of said housing for recooling said fluid acted upon by a flow of air (7b) from said air pump.

5. The cooling device according to claim 1, additionally comprising a generator (11) driven by said turbine for generating electric energy from the lost heat output of said arrangement.

6. The cooling device according to claim 1, wherein said electric component includes power electronics.

7. The cooling device according to claim 1, wherein said turbine is one of a steam turbine and a displacement machine.

8. A vehicle comprising an at least partially enclosed powertrain compartment and the cooling device according to claim 1; and wherein the arrangement having at least one electric component is disposed in said powertrain compartment of the vehicle.

9. The cooling device according to claim 8, wherein the vehicle is a tracked vehicle or a skid steer vehicle.

10. The cooling device of claim 1, wherein the cooling device is independent from a vehicle cooling system.

* * * * *